United States Patent [19]

Grinberg et al.

[11] Patent Number: 4,922,116
[45] Date of Patent: May 1, 1990

[54] FLICKER FREE INFRARED SIMULATOR WITH RESISTOR BRIDGES

[75] Inventors: Jan Grinberg, Los Angeles; Murray S. Welkowsky, Chatsworth, both of Calif.

[73] Assignee: Hughes Aircraft Company, Los Angeles, Calif.

[21] Appl. No.: 370,109

[22] Filed: Jun. 21, 1989

Related U.S. Application Data

[63] Continuation-in-part of Ser. No. 228,630, Aug. 4, 1988, abandoned.

[51] Int. Cl.$^5$ .............................................. H05B 3/26
[52] U.S. Cl. .............................. 250/495.1; 250/493.1; 250/504 R; 273/348.1; 219/553
[58] Field of Search ............ 250/495.1, 504 R, 443.1; 273/348.1; 219/553

[56] References Cited

U.S. PATENT DOCUMENTS

| | | | |
|---|---|---|---|
| 3,684,859 | 8/1972 | Desloge | 219/354 |
| 3,694,624 | 9/1972 | Buchta | 219/358 |
| 4,113,367 | 9/1978 | Fritzler | 352/7 |
| 4,126,386 | 11/1978 | Fritzler | 352/105 |
| 4,184,066 | 1/1980 | Svoboda | 219/354 |
| 4,239,312 | 12/1980 | Myer et al. | 339/17 |
| 4,329,312 | 12/1980 | Myer et al. | 339/17 N |
| 4,378,489 | 3/1983 | Chabinsky et al. | 219/543 |
| 4,472,239 | 9/1984 | Johnson et al. | 156/647 |
| 4,654,622 | 3/1987 | Foss et al. | 338/14 |
| 4,537,471 | 8/1985 | Grinberg et al. | 350/333 |
| 4,582,395 | 4/1986 | Morozumi | 350/334 |
| 4,644,141 | 2/1987 | Hagen et al. | 219/543 |
| 4,714,921 | 12/1987 | Kanno | 340/784 |
| 4,724,356 | 2/1988 | Daehler | 313/522 |

FOREIGN PATENT DOCUMENTS 0063415 10/1982 European Pat. Off. .

OTHER PUBLICATIONS

R. Watton, "Ferroelectrics for Infrared Detection and Imaging", Proceedings of the 6th IEE Internat'l Symposium on the Application of Ferroelectrics, Jun. 1986, pp. 172-181.

Boninsegni et al., "Low Temperature Bolometer Array", Review of Scientific Instruments, vol. 60, No. 4, Apr. 1989, pp. 661-665.

Tsaur et al., "TR Si Schottky-Barrier Infrared Detectors with 10 µm Cutoff Wavelength", IEEE Electron Device Letts., vol. 9, No. 12, Dec. 1988, pp. 650-653.

Lahiji et al., "A Batch-Fabricated Silicon Thermopile Infrared detector", IEEE Transactions on Electron Devices, Jan. 1982, pp. 14-22.

Bly, "Passive Visible to Infrared Transducer for Dynamic Infrared Image Simulation", Optical Eng'g., Nov./Dec. 1982, pp. 1079-1082.

Wu et al., "Infrared Liquid Crystal Light Valve", Proc. of the SPIE, vol. 572, Aug. 1985, pp. 94-101.

Daehler, "Infrared Display Array", SPIE vol. 765, Imaging Sensors and Displays 1987, pp. 94-101.

Burriesci, "A Dynamic RAM Imaging Display Technology Utilizing Silicon Blackbody Emitters", SPIE vol. 765, Imaging Sensors and Displays, 1987, pp. 112-122.

*Primary Examiner*—Jack I. Berman
*Attorney, Agent, or Firm*—V. D. Duraiswamy; P. M. Coble; W. K. Denson-Low

[57] ABSTRACT

An infrared (IR) simulator is disclosed in which an array of pixels is defined on an insulative substrate by resistor bridges which contact the substrate at spaced locations and are separated from the substrate, and thereby thermally insulated therefrom, between the contact locations. Semiconductor drive circuits on the substrate enable desired current flows through the resistor bridges in response to input control signals, thereby establishing the appropriate IR radiation from each of the pixels. The drive circuits and also at least some of the electrical lead lines are preferably located under the resistor bridges. A thermal reflector below each bridge shields the drive circuit and reflects radiation to enhance the IR output. The drive circuits employ sample and hold circuits which produce a substantially flicker-free operation, with the resistor bridges being impedance matched with their respective drive circuits. The resistor bridges may be formed by coating insulative base bridges with a resistive layer having the desired properties, and overcoating the resistive layers with a thermally emissive material. The array is preferably formed on a silicon-on-sapphire (SOS) wafer. Arrays of electromagnetic radiation bridge detectors may also be formed, with the bridges having either resistor, thermocouple or Schottky junction constructions.

38 Claims, 3 Drawing Sheets

FLICKER FREE INFRARED SIMULATOR WITH RESISTOR BRIDGES

This application is a continuation-in-part of Ser. No. 228,630, filed Aug. 4, 1988, abandoned.

BACKGROUND OF THE INVENTION

1. Field of the Invention

This invention relates to systems for simulating an infrared image for use in testing infrared seekers. It also relates to detector arrays for electromagnetic radiation including infrared and microwave.

2. Description of the Related Art

It would be highly desirable to be able to simulate a real-time infrared (IR—roughly 0.7–20 microns wavelength) image that is substantially free of flicker. This would provide an effective way to test IR detectors, also referred to as "seekers" and "focal plane arrays". At present, problems of excessive flicker impose a serious constraint on IR simulation systems. A basic problem with image flicker is that it creates a false target indication, since flicker corresponds to a change in the temperature of the IR image. Unlike the human eye which integrates light flicker over a period of about 30–50 msec., IR detectors integrate flickers over periods of only about 1–5 msec. Thus, there is a significant range over which flicker (in the visible spectrum) would not be detected by the human eye but would be picked up by an IR detector if it is within the IR spectrum.

Excessive flicker has been avoided heretofore with the use of a Bly cell to project a static image that has been applied to the cell. Bly cells are described in Vincent T. Bly, "Passive Visible to Infrared Transducer for Dynamic Infrared Image Simulation", Optical Engineering, Nov./Dec. 1982, Vol. 21, No. 6, pp. 1079–1082.

However, the requirement that this type of system be operated with a static image is a significant limitation, since a more meaningful test of IR detectors calls for the detection of images that can change in real-time.

A prior attempt to produce an IR simulation system with a real-time image involved the formation of a video image by a cathode ray tube (CRT). The CRT video image was applied as an input to a liquid crystal light valve (LCLV), to which an IR readout beam was applied. The LCLV modulated the IR readout beam with the video image from the CRT to produce a corresponding IR video image. See S. T. Wu et al, "Infrared Liquid Crystal Light Valve", Proceedings of the SPIE, Vol. 572, pages 94–101, August, 1985.

This approach unfortunately was found to result in a substantial amount of flicker. The problem is that the illuminated pixels on the CRT screen decay in intensity over time prior to the next electron beam scan. This causes an undesirable intensity gradient to appear on a projected IR image from an IR-LCLV which is coupled to the CRT, and an IR detector will then detect a non-uniform image. Because the detector is generally looking for intensity gradients, or edges, by which its associated algorithms determine the presence of "targets", such intensity gradients are misleading. While this problem could theoretically be solved by synchronizing the IR detector scan with the CRT electron beam scan, such synchronization may not be desired in many applications. Thus, although an IR-LCLV has the capability of projecting high resolution, high dynamic range, real-time simulated IR images when compared to a Bly cell, this advantage is mitigated by the CRT pixel decay. Furthermore, electrically driven matrix emitter devices have flicker if driven with simple RC-type pixel addressing circuits, since the RC decay is similar in effect to the phosphor decay of the CRT.

Modifications of the basic CRT-LCLV system described above might be envisioned to reduce or eliminate flicker, but they introduce other problems. In one such modification, two storage CRTs are provided with shutters in front of each screen. Operation is alternated between the two CRTs by means of the shutters, so that they are alternately applied to the LCLV. By staggering the video data frames between the two CRTs, the phosphor decay seen by the LCLV could theoretically be reduced significantly. However, in such a system, it may be difficult to implement the very fast shutter coordination that would be necessary to substantially avoid flicker. Furthermore, storage CRTs are non-uniform, resulting in image differences and consequent flicker.

Another approach would be to use a single CRT, but to increase the frame rate of the Raster scan from the conventional rate of about 30 Hz to a much higher rate, perhaps about 1,000 Hz. The CRTs of the future may provide higher bandwidths than that presently attainable, thereby making this approach more attractive.

A possible approach which does not provide real-time addressable images is the use of a "flicker-free" film or slide projector like the SCANAGON® device produced by Robert Woltz Associates, Inc. of Newport Beach, Calif. and disclosed in U.S. Pat. Nos. 4,113,367 and 4,126,386, or a comparable image projector. While the potential may exist for this limited technique, it has not been demonstrated to provide jitter-free and flicker-free images. Furthermore, this method will not provide real-time electronically updatable imagery.

In addition to flicker-free images, it is very important for an IR simulation system to achieve high spatial resolution, large dynamic temperature ranges and fast response. Spatial resolutions should be at least 500×500 pixels, with flicker less than 1%. For some applications frame rates should be 100 Hz or greater, and the dynamic thermal range should ideally be from near room temperature (some applications require cooled background temperatures) to 1,000° C., particularly in the 3–5 micron spectral range. This combination of dynamic range and response time requirements is difficult for commercially available liquid crystals to achieve. Furthermore, most IR simulation applications require the simulator to be mounted on the two-axis target arm of a Carco table, which is then moved relative to the IR seeker being tested. For this purpose weight and size limitations are very important. The liquid crystal based IR simulator requires a large black-body source, typically in excess of 100 pounds, and an expensive wire grid polarizer to be mounted with the active matrix. This reduces the mobility of the supporting Carco table arm.

Liquid crystal systems are also limited in dynamic range because it is difficult to photogenerate enough charge in the silicon substrate, while maintaining spatial resolution, to rotate the liquid crystal molecules completely. Furthermore, there is a restriction on the speed of response of liquid crystals if a reasonable thermal dynamic range is to be maintained. The flicker problem associated with liquid crystal systems can be reduced by utilizing a flicker-free visible addressing source for the liquid crystal light valve. However, known sources of this type are limited in speed, resolution, weight and size.

U.S. Pat. No. 4,724,356 to Daehler discloses a resistor-based IR simulator in which an array of resistors are individually addressed to stimulate IR emission. The Daehler approach is also discussed in Daehler, "Infrared Display Array", SPIE Vol. 765, *Imaging Sensors and Displays* (1987), pages 94–101 and Burriesci et al., "A Dynamic RAM Imaging Display Technology Utilizing Silicon Black-body Emitters", SPIE Vol. 765, *Imaging Sensors and Displays* (1987), pages 112–122. Both the resistors and their respective drive transistor circuits are formed from a bulk silicon wafer. An air gap groove is formed under the resistors to help reduce thermal conduction losses to the underlying bulk silicon wafer. To facilitate the selective etching used to form the insulating air gap grooves, the top layer of the wafer is heavily doped. However, this doping makes the top layer electrically conductive, resulting in a significant impedance mismatch between the resistors and their respective transistor drive circuits. As a result, most of the input power is lost in the drive circuitry, rather than going into IR radiation. This reduction in the power transfer to the resistors results in a need for even more input power to the transistors, leading to a potential overheating problem.

In addition to an inefficient use of input power, in the Daehler approach only a relatively small portion of the pixel area (less than 10%) is actually occupied by the radiating resistor. Much of the area that might otherwise be devoted to the resistor is occupied by the drive transistors and the insulating air gap. As a result, to achieve a given apparent temperature for the pixel as a whole the resistor itself must be heated to a significantly higher temperature. This substantially reduces the system's effective thermal dynamic range.

Another problem with the Daehler approach relates to the electrical lead lines used to address the individual pixels. Relatively large silicon wafers must be used with present technology to achieve a significant number of pixels. For example, a wafer of about four inches is required for a 512×512 array. This means that the electrical lead lines on the chip must also be about four inches long. This in turn leads to two significant problems. First, there is a large amount of capacitive coupling associated with the long lead lines. Parasitic capacitance between conductive substrate and metal lead lines can limit the response time. Second, defects such as pin holes can appear in the oxide insulator formed on the substrate, causing a short circuit between the line and the silicon substrate which renders the associated pixel or pixels inoperative. The longer the lines, the greater is the probability of such defects. Daehler tries to resolve this problem by limiting the size of the array to 8×128 pixels, and coupling many such arrays together side-by-side to produce an aggregate array of reasonable size. However, the coupling process itself introduces significant complexities.

There is also a need for a two-dimensional IR detector array, and for detector arrays at other electromagnetic radiation (emr) wavelengths such as microwave, which have a fast response and make efficient use of available area.

Various types of IR thermal detectors are currently available. In pyroelectric detectors, a temperature change alters the dipole moment of the material, resulting in a change difference between crystal faces. This type of detector is discussed in an article by Watton, "Ferroelectrics for Infrared Detection and Imaging", Proceedings of the Sixth IEEE International Symposium on the Application of Ferroelectrics, June 1986, Bethlehem, Pa., pages 172–181. Another type of IR detector is the bolometer, in which the energy of absorbed radiation raises the temperature of the detecting element to change its electrical resistance, which change is measured as an indication of the amount of received radiation. An array of such devices is disclosed in Boninsegni et al., "Low Temperature Bolometer Array", Review of Scientific Instruments, Vol. 60, No. 4, April 1989, pages 661–665. Both the pyroelectric and bolometer devices exhibit a relatively slow rate of response to changes in IR level, and also require relatively large areas. The pyroelectric thermal detector also suffers from limited resolvable temperature differences, low yield and high cost processing, a necessary hybrid integration and AC operation with a chopper. The limited temperature resolution, which is principally due to the inherent thermal conduction loss and large thermal mass, can be improved by thinning and reticulating the pyroelectric wafer, but this involves very difficult and expensive processing.

Another approach to IR detection involves an array of single crystal Schottky junctions, as disclosed in Tsaur et al., "IR Si Schottky-Barrier Infrared Detectors With 10-$\mu$m Cutoff Wavelength", *IEEE Electron Device Letters*, Vol. 9, No. 12, December 1988, pages 650–653. This device is used as a photon detector rather than a thermal detector, has a very limited spectral range, and has to be operated at cryogenic temperatures.

Thermocouple devices provide another IR thermal detector. In this type of device junctions are formed between dissimilar materials, with a voltage induced across the junction in response to heating. Such a device is disclosed in Lahiji et al., "A Batch-Fabricated Silicon Thermopile Infrared Detector", IEEE Transactions on Electron Devices, Jan. 1982, pages 14–22. In this article a series of thermocouples have hot junctions which are supported on a thin silicon membrane by integrated circuit techniques. The membrane area is coated with a layer of IR absorbing material to efficiently absorb energy from the visible to the far infrared. The sensitivity of the device is limited because the thermocouples are formed directly on the substrate and therefore cannot heat as much as desired due to the thermal conduction losses. Also, a relatively large area is required for the detector.

Bolometers and crystal detectors have also been used to sense emr at microwave frequencies. Since relatively large sensor dimensions are necessary, single detectors have been used to scan an incoming image, rather than using a detector array to sense the entire image at one time. The result has been slow frame rates. The same problem has attended the use of single scanning junction detectors in the IR require.

SUMMARY OF THE INVENTION

In view of the above problems, the goal of the present invention is to provide an IR simulation system which is substantially flicker-free, light in weight, has a large thermal dynamic range and fast response, is power efficient, devotes most of the pixel area to the radiating element, and avoids the capacitive coupling and insulator defect problems associated with long lead lines on a single crystal semiconductor substrate. A two-dimensional emr detector array with similar characteristics is also included.

This goal is achieved in accordance with the invention by providing an IR pixel matrix in the form of an array of resistor bridges formed on an insulating substrate, such as sapphire. The resistor bridges span a portion of each pixel cell, contact the substrate at spaced-apart contact locations, and are shaped to form a thermally insulative gap between the bridge and substrate. A semiconductor drive circuit on the substrate enables a desired amount of current flow through the bridge in response to an input control signal to heat the bridge, thereby producing a desired amount of IR radiation. Control, actuating and power lead lines extend along the substrate to deliver control and actuating signals to the drive circuits, and an electrical power signal to the resistor bridges; since the substrate is insulative, capacitive coupling and shorting problems are mitigated even with long lead lines.

In the preferred embodiment the drive circuits are located on the substrate surface under the resistor bridges, and at least some of the lead lines also extend under the bridges. Each pixel cell includes a thermally reflective element between the resistor bridge and drive circuit to reflect IR radiation away from the drive circuit. The thermally reflective element may comprise either a second bridge formed from a thermally reflective material which bridges the drive circuit and is spaced from both that circuit and the resistor bridge, or a thermally reflective layer which overlies an insulative layer on the drive circuit.

To reduce flicker to less than 1%, the drive circuit for each pixel comprises a sample and hold circuit in which a first transistor applies a control signal to a holding capacitor, and a second transistor applies a power signal to the resistor bridge in response to the capacitor signal. The electrical impedance of the resistor bridge preferably matches that of the drive circuit.

The resistor bridges may be implemented in various ways. In one implementation they comprise a base bridge formed from an insulative material, with a resistive layer over the base. The resistivity and thickness of the resistive layer are selected to produce a desired resistance. The resistive layer may itself be surmounted by a coating of high thermal emissive material. The resistor bridge may also be formed from a material having an enhanced porosity which decreases its thermal conductivity. To concentrate the voltage drops towards the centers of the bridges and away from their connections with the substrate, the bridges may be tapered so that their cross-sectional areas near the center are significantly less than near their contacts with the substrate.

The resulting IR pixel array has a significantly better combination of thermal dynamic range, speed of response, resolution, weight, size, efficiency and flicker-free operation than any other known system.

The invention also includes two-dimensional emr sensing arrays consisting of an array of emr detector cells formed on a substrate. Each cell includes an emr sensitive bridge structure. The shape of the bridge structure is designed to form a generally insulative gap between the bridge and the substrate. The bridge structure has a defined characteristic which varies with the amount of received emr, and means are provided for monitoring this characteristic for each of the cells to determine the level of emr incident on each cell.

The bridge structures can be implemented by resistor bridges, thermocouple junction bridges, or Schottky junction bridges. With resistor bridges, various bridge geometries may be selected to reduce the area of the bridge support legs relative to the center span, and thereby assist in thermally insulating the center span from the substrate. Multiple-stage amplifier readout circuits are preferably employed in connection with output voltage divider circuits to monitor the effective bridge resistances with a reduced Johnson noise. This layers of conductive material may be added to the support legs to electrically connected the center span to the underlying monitoring circuits, the conductive material layers being thin enough to substantially maintain the thermal isolation of the bridge center spans from the substrate. The resistor bridges are preferably formed from an amorphous semiconductor material.

With a thermocouple bridge detector array, the thermocouples preferably comprise a stacked plurality of alternating semiconductor and metal layers. The junction devices are connected in series with resistors and output voltage divider circuits, with the voltages across the output resistors monitored as a function of the emr received by the thermocouple bridges.

The Schottky junction bridge embodiment employs a bridge configured as adjacent layers of a semiconductor material and a metal or doped semiconductor, meeting along a Schottky contact junction. The semiconductor is preferably amorphous germanium or amorphous tin.

The detector bridges are preferably coated with a layer of emr absorbing material to increase their sensitivity. Readout circuits for each detector cell are preferably located on the substrate at least partially under their respective bridges to conserve substrate area. Various lead lines may also extend under the bridge structures to further conserve substrate area. A lens is employed to image an emr source onto the two-dimensional array.

Additional features and advantages of the invention will be apparent to those skilled in the art from the following detailed description of preferred embodiments, taken together with the accompanying drawings, in which:

DESCRIPTION OF THE DRAWINGS

FIG. 11 is a sectional view of a resistor bridge emr detector and readout circuit in accordance with the invention;

FIGS. 12(a), 13(a) and 14(a) are plan views and FIGS. 12(b), 13(b) and 14(b) are front elevation views of three different resistor bridge configurations which thermally isolate the center span of the bridge from the underlying substrate;

DETAILED DESCRIPTION OF THE INVENTION

Figure 1:
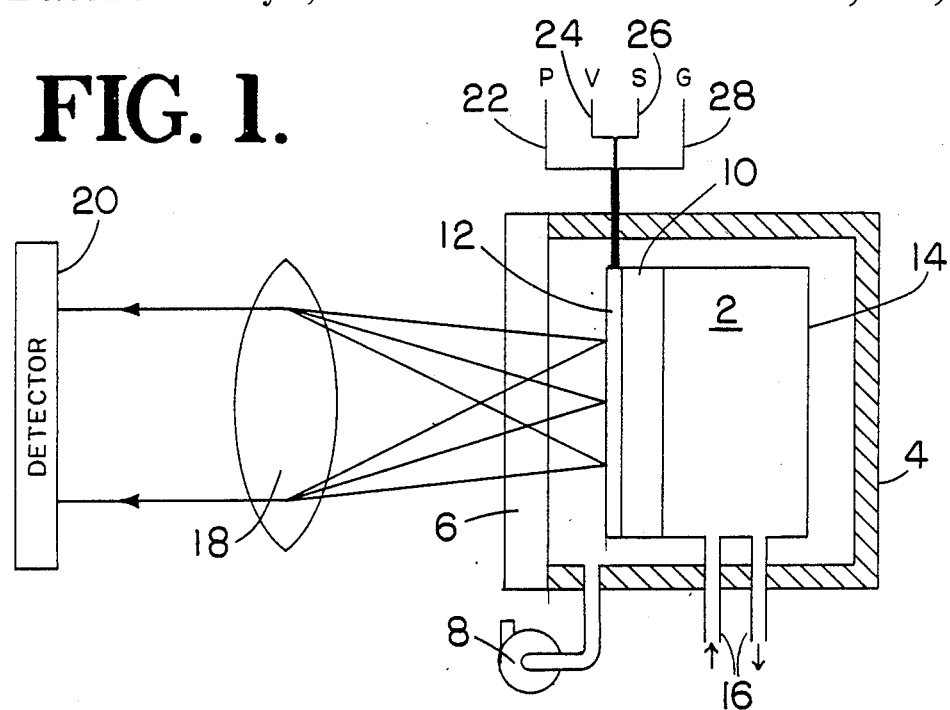
FIG. 1 is a block diagram of an IR simulator system which incorporates the present invention.

FIG. 1 shows the basic elements of an IR simulation system constructed in accordance with the invention. An IR radiating mechanism 2 is placed within a vacuum chamber 4 which has an IR window 6 at its forward end. A vacuum pump 8 evacuates the chamber in a conventional manner. The IR structure includes an insulative substrate 10, preferably sapphire, a two-dimensional array 12 of IR emitting elements on the forward side of substrate 10, and a cooling mechanism 14 contacting the rear of the substrate. The cooling element is preferably a copper block cooled by water or freon flowing through inlet and outlet pipes 16. The IR window 6 is formed from a suitable material such germanium or zinc selinide, and is preferably provided with an anti-reflective coating to prevent reflection of emitted IR radiation back into the chamber.

The individual IR emitting elements within the array 12 provide controlled emissions which are directed by a lens 18 onto an IR detector 20 being tested. The emissions from each individual IR radiating element are controlled by electrical signals applied to the array. The electrical leads into the array include a power line 22 connected to a DC power source, a series of data lines 24 which carry image information signals to the various IR elements, a series of strobe lines 26 which strobe rows of IR elements in succession in coordination with the image signal, and a ground line 28. The image data input signals may represent an actual video image, a computer simulation, or other desired pattern.

Figure 2:
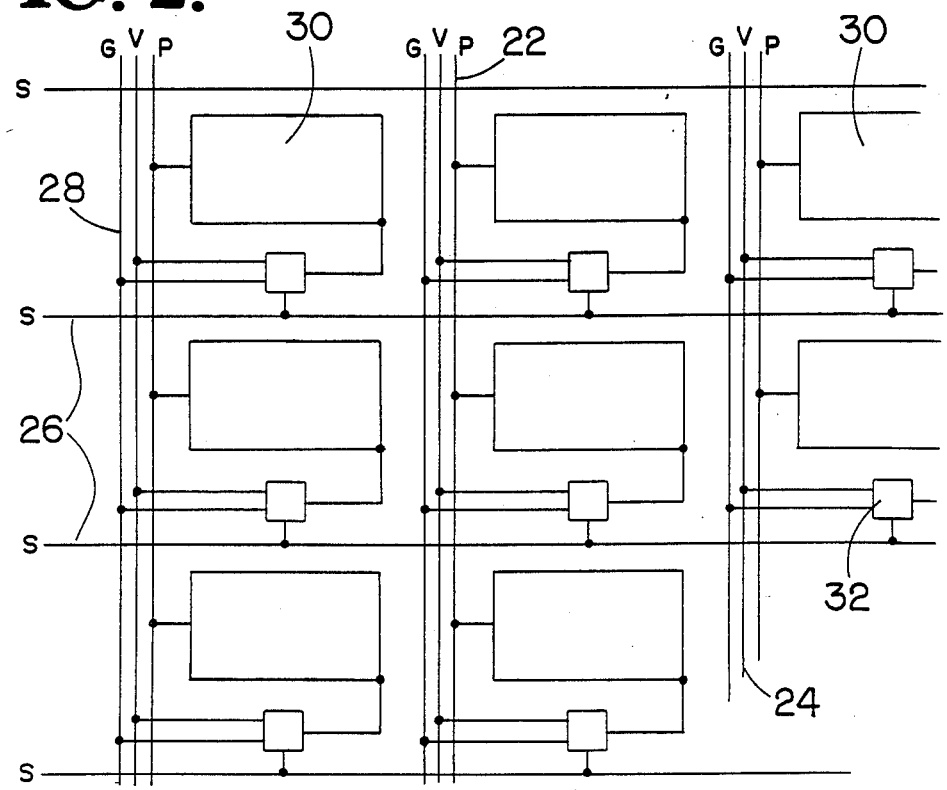
FIG. 2 is a diagrammatic plan view of a portion of the pixel cell array used to create an IR image.

The IR radiating array is divided into a matrix of pixel cells, each of which is individually controlled to emit a desired amount of IR radiation. The resolution of the IR image is governed by the number of pixels, which are typically provided in a 256×256, 512×512 or 1024×1024 array. A section of such an array is illustrated in FIG. 2. Each pixel cell includes a resistor bridge 30, which is the actual IR radiating element, and a drive circuit 32 for the resistor bridge. Each pixel cell is typically about 150 microns square, while the resistor bridges are about 120 microns square. The drive circuits employ two transistors, each of which is typically about 50 microns square. The aluminum electrical lead lines are typically about 25 microns wide.

FIG. 2 is a simplified drawing which illustrates the functional relationship between the various elements in the array, but does not show them in their preferred physical arrangement; this will be discussed further below. One end of each resistor bridge 30 is connected to a DC power line 22, while the other end is connected to its associated drive circuit 32. Each drive circuit acts in response to an applied image signal from line 24 to control the flow of current from the power line, through the resistor bridge and drive circuit to ground.

The pixel cells are arranged in a matrix of rows and columns. Electrical inputs are provided in a manner that allows each pixel to be separately programmed, yet avoids the need for separate lead lines for each pixel. Discrete signals are applied to the line 24 for each column, so that each drive circuit in a given column receives the same signal, but the signals vary from column-to-column. Each row of pixel cells is strobed in succession via strobe lines 26, which are connected to the pixel drive circuits. The application of a strobe signal enables the operation of a drive circuit, which otherwise holds off the flow of any current through the resistor bridge. By varying the pattern of image data signals in synchronism with the progression of the strobe signal from row-to-row, a unique signal can be applied to each pixel cell to establish the resistor current through that cell at a unique value. The drive circuits are designed so that they can acquire an image data signal only during the brief period when the circuit is being strobed, so that the changing pattern of signals while other rows are being strobed has no effect upon the signal acquired by a particular pixel. Each drive circuit includes a sample and hold circuit which holds the acquired image data signal during the period of time required to strobe all of the other rows. With a frame rate in the order of 100 Hz, the sample and hold circuits keep the decay of the video signals acquired by their respective pixels to less than 1%. This results in a substantially flicker-free operation.

Figure 3:
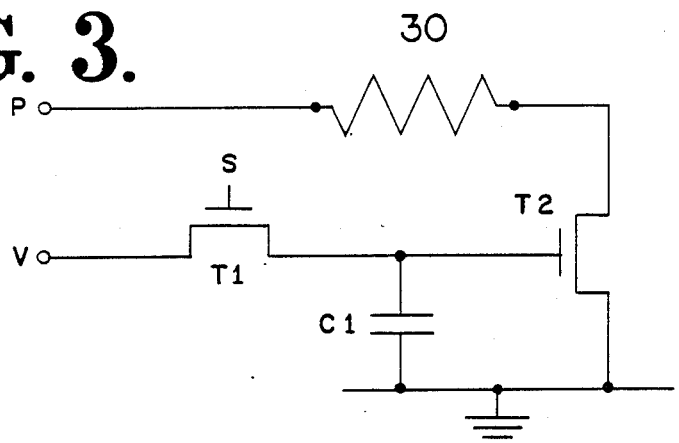
FIG. 3 is a schematic diagram of the drive circuitry employed in each pixel cell.

A schematic diagram of the preferred drive circuit for each pixel is given in FIG. 3. The circuit is preferably implemented with a silicon-on-sapphire (SOS) wafer in which the active circuit elements are formed from a silicon layer 12 on the sapphire substrate 10. SOS wafers are currently available in 5 inch diameters, and larger wafers will probably be produced in the future. Since an insulating substrate is employed, the prior problem of shorting and capacitive coupling from the lead lines is substantially eliminated, thereby permitting the use of large arrays.

Each sample and hold circuit includes a first FET T1 with its source-drain circuit connecting the image data input to a holding capacitor C1. The signal held by C1 is applied to the gate of a second FET T2, and controls the amount of current flow permitted by T2. The bridge resistor 30 is connected between the DC power source and the drain or source of T2, depending upon the transistor connection; the opposite source-drain terminal of T2 is connected to ground. Thus, the amount of current permitted to flow through resistor 30, and accordingly the amount of IR radiation emitted by resistor 30, is controlled by the video signal held by C1 and applied to the gate of T2.

Figure 4:
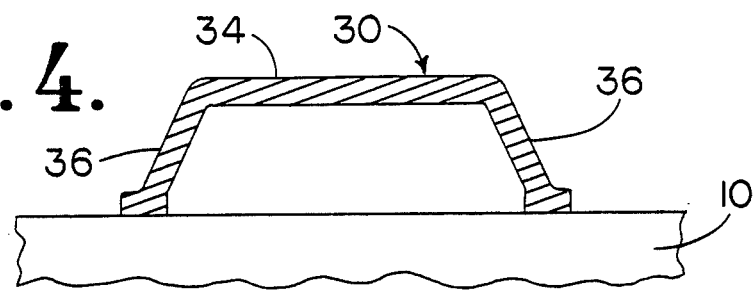
FIGS. 4–6 are sectional views showing different embodiments of the resistor bridge which provides the IR radiating element for each pixel.

A simple implementation of bridge resistor 30 is shown in FIG. 4. The resistor has a center span 34 that is elevated above the surface of sapphire substrate 10 by a pair of legs 36 at opposite ends of the center span. The vertical air gap clearance between center span 34 and the substrate is preferably about 2-5 microns, which is sufficient to prevent substantial thermal conduction loss from the resistor to the substrate. The method of forming such a bridge resistor is known, and is described in U.S. Pat. No. 4,239,312 to Myer et al., assigned to Hughes Aircraft Company, the assignee of the present invention. The bridge resistor could also be implemented with electrically conductive, metallic vertical legs and a planar center span of resistor material. In this configuration, because the legs have high electrical conductivity, there is a proportionate reduction in the voltage-induced thermal gradients, and reduction in stress.

Whereas the resistors employed in the Daehler IR simulator were limited to boron doped silicon because of the bulk silicon substrate, with the present invention the resistor material can be selected to optimize its characteristics. Ideally, the resistor should have a low thermal conductivity to limit heat transfer to the substrate, an electrical conductivity which matches the resistor impedance to the impedance of the drive circuit, a low coefficient of thermal expansion to prevent the resistor from expanding significantly with respect to the lower temperature substrate, and a high melting point. One suitable resistor material is polysilicon, which has a high melting temperature, controllable resistivity, small temperature dependent resistivity, and a low coefficient of thermal expansion. Other materials which may be suitable include graphite, which has good temperature properties, high emissivity, titanium oxides, tantalum oxides, silicon oxides and cermets.

Figure 5:
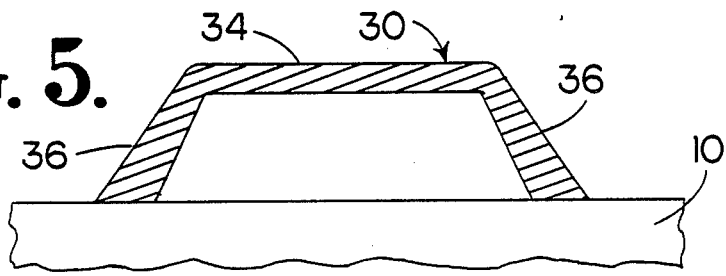

To minimize thermal stress at the junction between the bridge resistor and the substrate, the bridge may be fabricated as shown in FIG. 5 so that its legs 36 are relatively thick where they contact the substrate, and progressively taper in cross-sectional area towards the center span 34. This arrangement reduces the resistance of the legs, particularly in the vicinity of the substrate, and also adds mechanical support. Accordingly, the bulk of the voltage drop and the resultant high temperature will occur at the center span 34, which is desirable to both reduce mechanical stress and enhance IR radiation. The temperature of the bridge will be lower along its legs, particularly near the substrate, since less power is dissipated there.

Further protection against heat loss may be obtained by increasing the porosity of the resistor material through electron beam deposition or other suitable technique. An increased porosity reduces the thermal conductivity of the material, making it even less susceptible.

Figure 6:
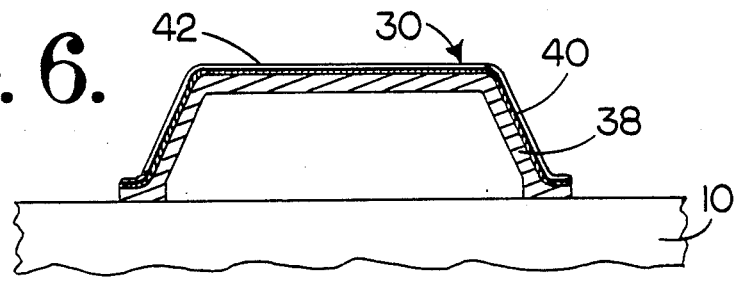

In another embodiment, illustrated in FIG. 6, the resistor bridge is formed from a base bridge 38 of insulative material such as $SiO_2$, with a thin resistive layer 40 over the base bridge 38. The resistivity and thickness of the resistive layer 40 are selected to produce the desired resistance for the bridge. A very thin metal or ceramic-metal (cermet) layer, preferably on the order of about 50 Angstroms thick, would be suitable. The insulative base bridge 38 should itself be made as thin as possible, consistent with the required mechanical support, to provide fast response and low thermal conductivity. $SiO_2$ about 0.5–1 micron thick would be suitable. The resistive layer 40 might be coated with a layer of high thermal emissive material 42, such as carbon black or gold black, to improve the radiative efficiency of the bridge. The thermally emissive layer may then be sealed with a sealing coat of $SiO_2$ about 50–100 Angstroms thick.

Figure 7:
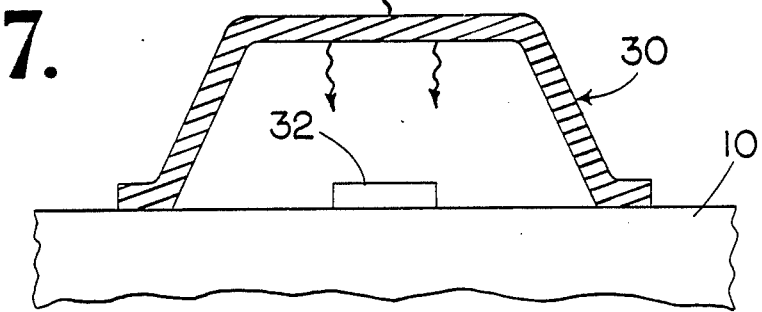
FIGS. 7–9 are sectional views illustrating various embodiments of the relationship between the resistor bridge of each pixel and the drive circuitry therefore.
Figure 8:
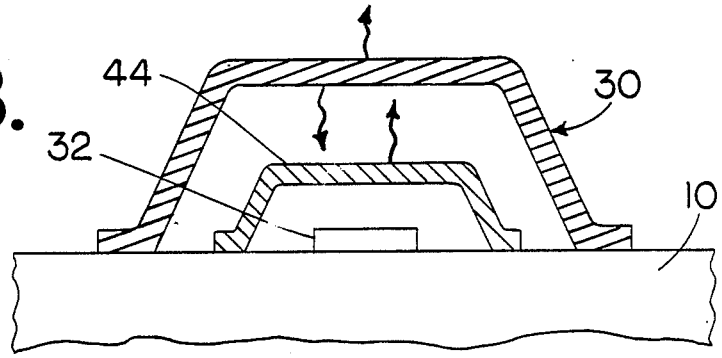

To preserve space on the substrate and free up more area for the resistor bridges, the drive circuits 32 are preferably located under the bridges, as illustrated in FIG. 7. To maintain the drive circuitry at reasonable operating temperatures, it may be shielded from the heat of the resistor by means of a second bridge 44 as illustrated in FIG. 8. This second bridge is spaced from both the resistor bridge 30 and the drive circuit 32, and is formed from a thermally reflective material such as aluminum. In addition to protecting the circuit elements from overheating, the reflective bridge 44 increases the pixel output power, since most of the IR radiation which it reflects is transmitted through the thin resistor bridge to enhance the output IR radiation.

Figure 9:
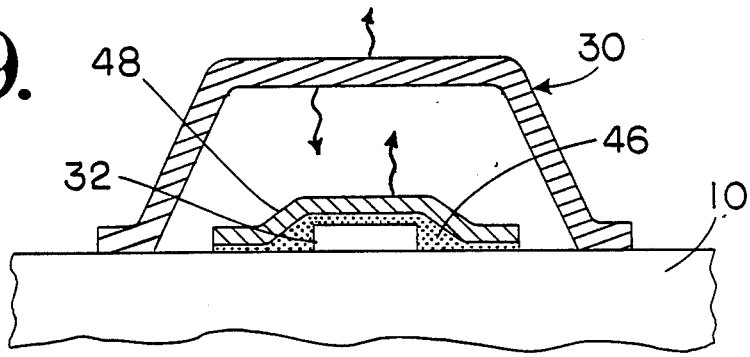

FIG. 9 illustrates an alternate to the discrete reflective bridge 44. In this embodiment an electrically insulative layer 46 such as $SiO_2$ is laid down over the drive circuit 32, followed by a thermally reflective layer 48 such as aluminum over the insulative layer.

Figure 10:
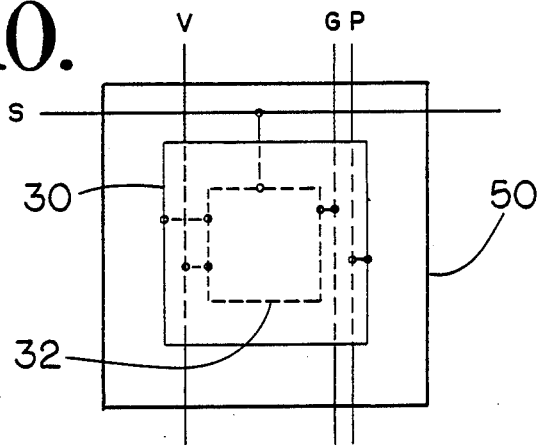
FIG. 10 is an illustrative plan view showing the disposition of electrical lead lines with respect to the resistor bridge for one embodiment.

Additional area on the array may be conserved and devoted to the radiating resistor elements by directing at least some of the lead lines under the bridge resistors. Such an arrangement is illustrated in FIG. 10. In this single layer metallization scheme, the image data, power and ground lines for each pixel 50 are run under the resistor bridge 30, while the strobe line extends along the side of the resistor. With a double layer metallization, all four lines could be separated by insulating layers and run under the bridge. Single and double layer metallization techniques are well known in the art. For further savings in real estate, adjacent pixels could share the same power and ground lines.

The preferred technique for fabricating the array is to first fabricate the drive circuits on an SOS wafer. The whole substrate is then covered with a spacer layer, such as potassium chloride or aluminum, which can be selectively etched. A resist layer is then laid on top of the spacer layer to define the pixels. The resist at the intended resistor bridge locations is next exposed, the unexposed resist is washed off, and the spacer layer below the removed resist is etched away. After removing the remaining resist the bridge material is overcoated on the remaining spacer layer by a technique such as sputtering or electron beam evaporation, depending upon the bridge material and properties desired. A shadow mask technique might also be employed to form the bridges, but it is difficult to obtain desirably high pixel density and small bridge dimension with this technique. Finally, the remaining spacer material is removed by standard techniques, such as dissolving away potassium chloride or etching away aluminum.

With the described IR simulation system, 60–65% of the pixel area can be devoted to the resistor. As a result, the resistors do not need to be heated to as high a temperature to attain a given effective pixel temperature as with the prior system that employed much smaller resistors. The resistors can be tailored to impedance match the drive circuits, thereby significantly improving the efficiency of the device. The problems of capacitive and electrical shorting associated with the lead lines is also substantially alleviated. The device is calculated to have an effective thermal dynamic range of 1,000° C. in the b 3–5 micron region, and 600°–700° C. in the 8–12 micron region (with the substrate at room temperature). Frame rates of 200 Hz are achievable without bothersome flicker.

The bridge structure of the present invention can also be used as a sensitive and space-efficient emr detector for IR, microwave and other wavelengths. A particular range of wavelengths can be selected for sensing by an appropriate selection of the bridge dimensions, generally following the rule that the length of the bridge should be at least half the desired wavelength. IR wavelengths are quite small, so the bridges in this range will generally be considerably larger than a half wavelength. Microwave wavelengths are much longer, on the order of cms., so microwave detector bridges would not need to be much bigger than a half wavelength. With the use of a refractive lens or, in the case of microwaves, a focusing reflector, the emr beam can be at least partially focused to permit the use of smaller detector bridges.

FIG. 11 illustrates a resistance bridge detector that can be used for this purpose. The bridge 52 consists of a center span 54 with support legs 56 at either end extending up from a substrate 57, and a readout circuit 58 on the substrate under the chip and at least partially shaped thereby from incident emr.

A preferred material for the bridge is amorphous silicon, which has a relatively high temperature coefficient of resistance, is compatible with integrated circuit processing, and can be formed with controlled mechanical stresses. Other amorphous semiconductors are also suitable, such as Ge, SiGe, and SiC. Materials which are generally unsuitable for the resistor bridge include metals because of high thermal conductivity and a low electrical resistance and low temperature coefficient of resistance, insulators because of low electrical conductivity, and cermets because of low temperature coefficients of resistance. The substrate 57 is preferably single crystal silicon for relatively small dimensions in the IR regime, or a silicon-on-insulator construction for larger microwave dimensions.

A layer 60 of an emr absorbent material, such as a metallic black or black paint for IR, is provided on the bridge center span, which is the emr target area, to increase the emr-induced temperature variation. Various geometric configurations for the bridge can also be designed to assist in thermally isolating the center span from the substrate, and thereby increase the potential degree of heating for the center span and thus the device's sensitivity. This goal may be accomplished by making the cross-sectional areas of the legs which support the center span much less than the area of the center span emr target area. The FIGS. 12(a) and 12(b) the center span 54a is rectangular, while a pair of support legs 56a extend from opposite sides of the center span and are quite narrow where they meet the center span. The support legs broaden out to the same width as the center span along the substrate to provide a more secure bridge retention. By contrast, in FIGS. 13(a) and 13(b) the center span 54b has the same rectangular configuration, but the support legs 56b consist of narrow tabs 56b at each corner of the center span. In FIGS. 14(a) and 14(b) the center span 56 has a generally serpentine configuration to increase its effective length, and thereby enhance its thermal isolation, by increasing the length of the average thermal path between the center span and the substrate. Support legs 56c consists of narrow tabs at opposite end of the center span.

A thin metal layer, typically on the order of 100 Angstroms thick, is established over each of the support legs to provide an electrical shunt between the center span and the underlying readout circuit. This significantly reduces $I^2R$ heating in the legs. Because they are so thin, the metal layers themselves do not conduct heat significantly.

Figure 15:
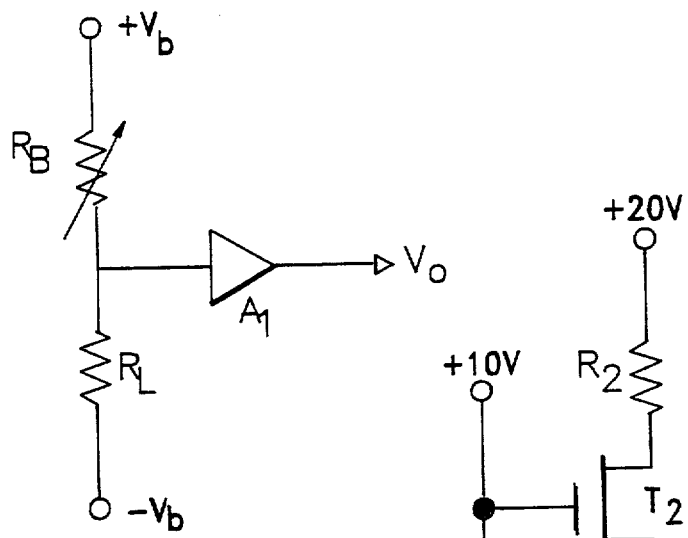
FIG. 15 is a simplified schematic diagram of a readout circuit for a resistor bridge emr detector.

FIG. 15 is a simplified schematic diagram of an output circuit that can be used to monitor the bridge resistance of each detector cell, and thereby the level of emr received by that cell. Similar readout circuits would be replicated for each of the individual cells. The circuit consists of a basic voltage divider formed by the variable bridge resistance $R_B$ in series with a load resistor $R_L$. Positive and negative bias voltages $V_b$ are applied across the series network, while the output at the midpoint of the two resistors is amplified by an amplifier A1 and delivered as an output voltage $V_O$. Any emr-induced change in $R_B$ will alter the bridge circuit, and adjust $V_O$ accordingly.

A computer model has been devised to estimate the performance of a thin amorphous silicon bridge detector of this type. The resulting estimation for the bridge responsivity to applied emr in a vacuum is $4 \times 10^3$ volts/watt, for an amorphous silicon bridge having at thermal conductivity of about 0.0256 J/cm/°K, a temperature coefficient of 2%, a resistivity of 100 ohm-cm, dimensions of $100 \times 40 \times 1$ microns, and a bias voltage $V_b$ of 5 volts. Assuming Johnson (or resistive) noise is a limiting source of noise figure, the estimated noise equivalent power is near $3.4 \times 10^{-10}$ W, and the corresponding detectivity is $1.8 \times 10^8$ cm $-Hz^{0.5}/W$ for an effective bandwidth of 100 Hz. The minimum resolvable temperature difference at 300° K background is then close to 0.17° C., and the total power consumption for a $320 \times 160$ detector array is on the order of 2 Watts. This estimated performance is quite suitable for applications of an uncooled IR imaging system.

Figure 16:
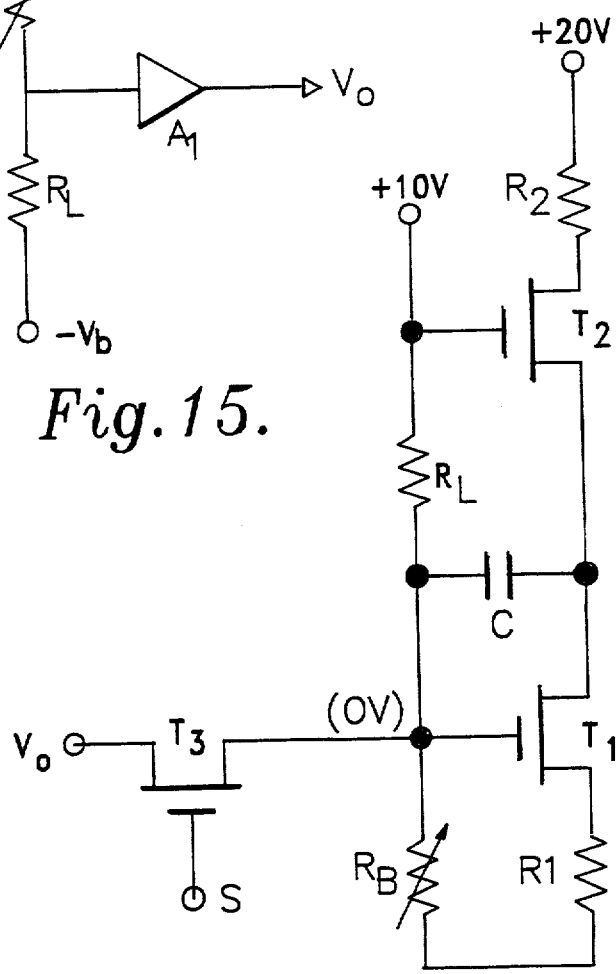
FIG. 16 is a more complete schematic diagram of the circuit shown in FIG. 15.

A more detailed schematic of an output circuit for each resistor bridge detector is provided in FIG. 16. Resistors R1 and R2 are chosen to maximize the product of the transistor transconductance and output resistances. The upper transistor T2 provides a large dynamic load, but relatively low static load, for the bottom amplifying transistor T1, resulting in a large gain.

Since the detector array will have a large number of output circuits of this type, one for each bridge detector, the output circuits are arranged in a matrix configuration with a strobe signal S applied to an output transistor T3 to obtain an output from each individual readout circuit at a desired strobe time. A capacitor C across the drain and gate of amplifier transistor T1 provides a large equivalent capacitance, and a corresponding low level of Johnson noise; the strobe readout process via T3 also discharges (resets) capacitor C. The equivalent capacitance of the circuit is given by the expression $C(1+A)$, where A is the amplifier gain.

Figure 17:
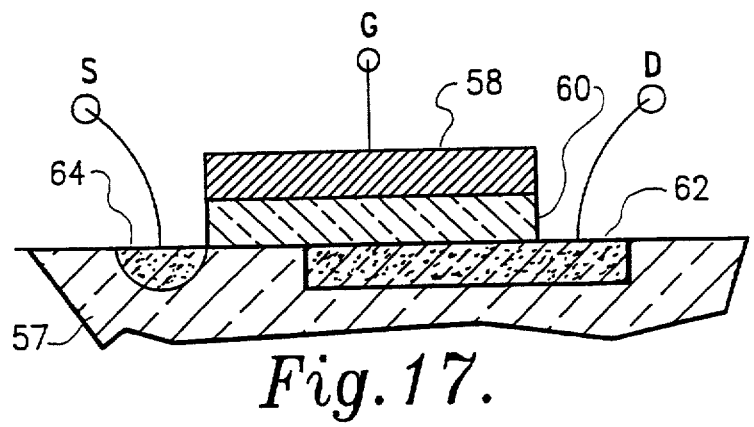
FIG. 17 is a sectional view showing the formation of transistor and capacitor of FIG. 16 in a single monolithic construction.

A physical construction by which T1 and C can be monolithically integrated into the same structure is shown in FIG. 17. A gate metallization 58 is formed over an oxide layer 60 on the substrate, with a heavily doped semiconductor layer 62 underlying a portion of metallization 58 and oxide 60, and extending laterally to one side. A gate connection is made to metallization layer 58, a drain connection is made to doped semiconductor layer 62, and a source connection is made to a heavily doped region 64 on the opposite side of oxide layer 60 from drain layer 62. The transistor channel comprises the portion of the substrate between drain 62 and source 64, while capacitor C is established by the aligned portions of gate metallization 58 and drain layer 62.

Figure 18:
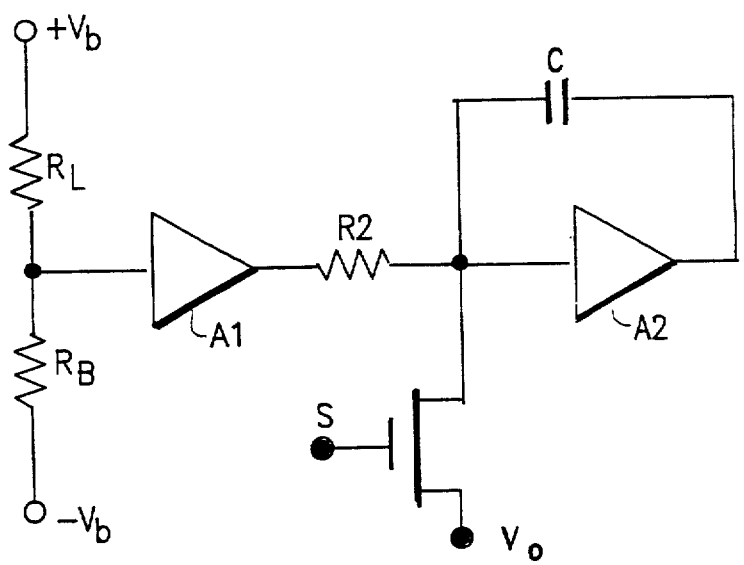
FIG. 18 is a schematic diagram of another readout circuit for a bridge resistor emr detector which reduces Johnson noise.

While the provision of a large equivalent capacitance in the circuit of FIG. 16 produces a significant reduction in Johnson noise, such noise is still a limiting factor in the operation of the circuit. An alternate readout circuit is shown in FIG. 18 which further reduces the Johnson noise level. This circuit employs a two-stage amplifier, with the capacitor C connected across the second amplifier A2 and an input resistor R2 for A2. Johnson noise is reduced by a factor of $\sqrt{R2/RL}$. In addition, the capacitance of C can be reduced, with a corresponding reduction in the chip area required by the capacitor, to the extent the total amplification of the two-stage amplifier of FIG. 18 exceeds the amplification of the single-stage amplifier discussed above.

Figures 19, 20:
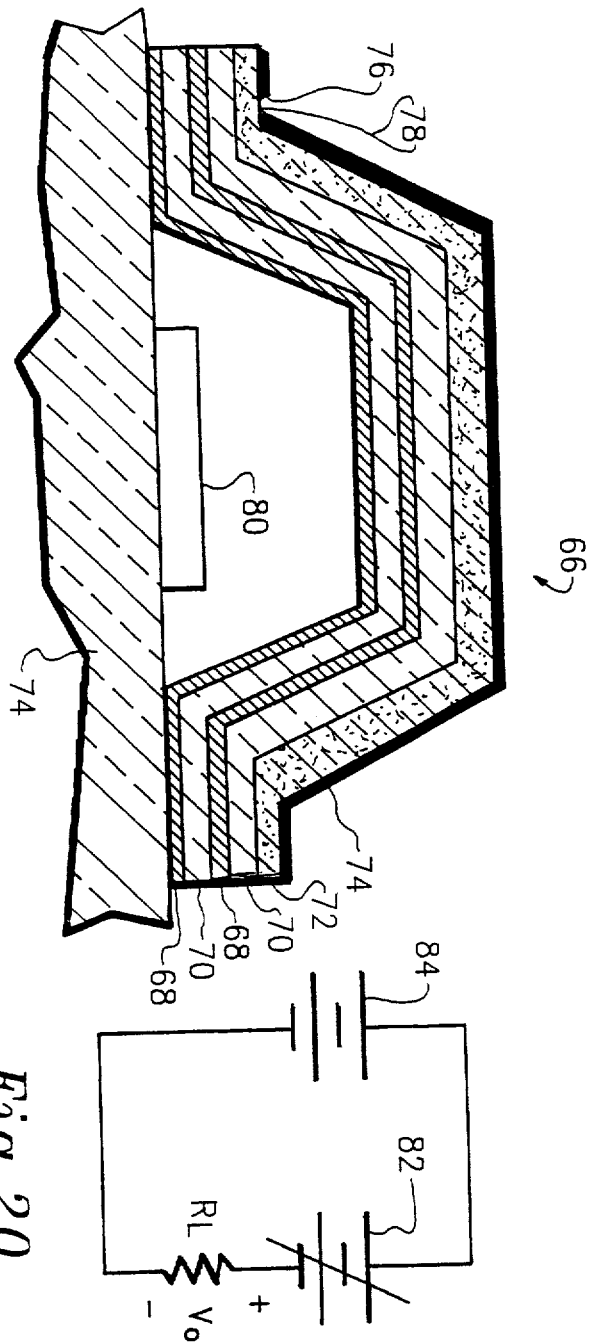
FIG. 19 is a sectional view of a thermocouple bridge emr detector.
FIG. 20 is a simplified schematic diagram of a readout-circuit for the detector of FIG. 19.

FIG. 19 shows a different form of bridge emr detector which, as with the resistance bridge detector discussed above, can be dimensioned to detect various emr wavelengths. The sensor is basically a thermocouple bridge 66 which generates a thermally induced voltage in response to received emr. It consist of a bridge structure with alternating layers of dissimilar materials. While in theory any two different materials could be used to produce a thermal junction voltage, metal-semiconductor junctions have generally been found to produce the highest voltage levels. The bridge is preferably fabricated as a stacked layer, with thin metal layers 68 such as platinum alternating with semiconductor layers 70 such as amorphous SiGe. The metal layers are preferably about 0.1–0.2 microns thick, while the semiconductor layers are about 0.5–2 microns thick to give sufficient mechanical strength. The thermocouple stack is surmounted by a heavily doped semiconductor back contact layer 72, which in turn is capped by a layer 74 of radiation absorbing material. The back contact layer 72 can be formed by a low energy ion implant to a depth on the order of 0.1 microns. A opening or "via" 76 is formed in the radiation absorbent coating 74 to provide a passage for an electrical lead line 78 to establish contact with back contact layer 72. A readout circuit 80 is provided on the substrate, below and at least partially shaped by the bridge 66, to monitor the emr-induced thermocouple voltage.

A simplified schematic of a readout circuit for this embodiment is given in FIG. 20. A load resistor $R_L$ is connected in series with the thermocouple junction, represented as a variable voltage source 82. A bias voltage source 84 is connected across this voltage divider circuit, with the voltage $V_O$ and $R_L$ monitored as an indication of the emr-induced voltage across the junction.

Figure 21:
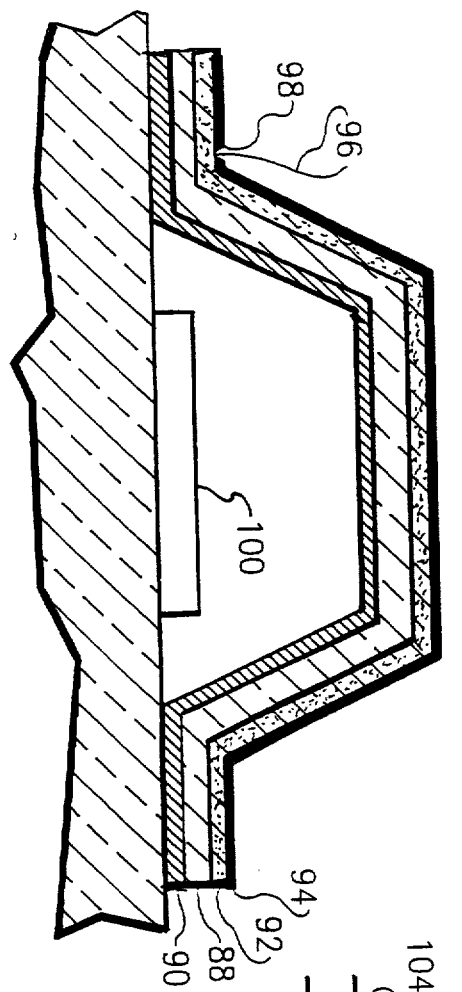
FIG. 21 is a sectional view of a Schottky junction bridge emr detector.

The detector array of the present invention can also be implemented as a Schottky junction bridge 86, illustrated in FIG. 21. In this embodiment, a semiconductor layer 88 is formed over a bridge-shaped metal layer 90 to establish a Schottky junction. The semiconductor layer 88 should have a small bandgap to obtain a high leakage current across the junction, with a corresponding high sensitivity. Semiconductors such as amorphous germanium or amorphous tin are suitable for this purpose. A heavily doped semiconductor that is substantially conductive can also be used instead of metal layer 90. As with the thermocouple embodiment, the bridge is topped by a doped back contact layer 92 and a radiation absorbent layer 94, with a lead 96 electrically contacting the back contact through a via 98 in the radiation absorbent coating.

Figure 22:
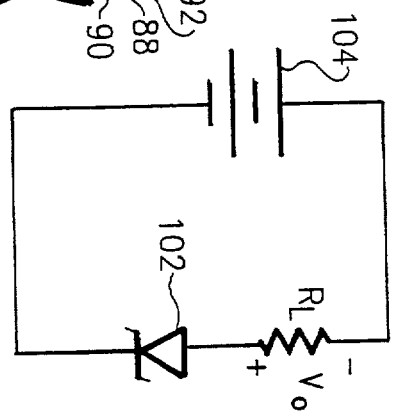
FIG. 22 is a simplified schematic diagram of a readout circuit for the emr detector of FIG. 21.
Figure 23:
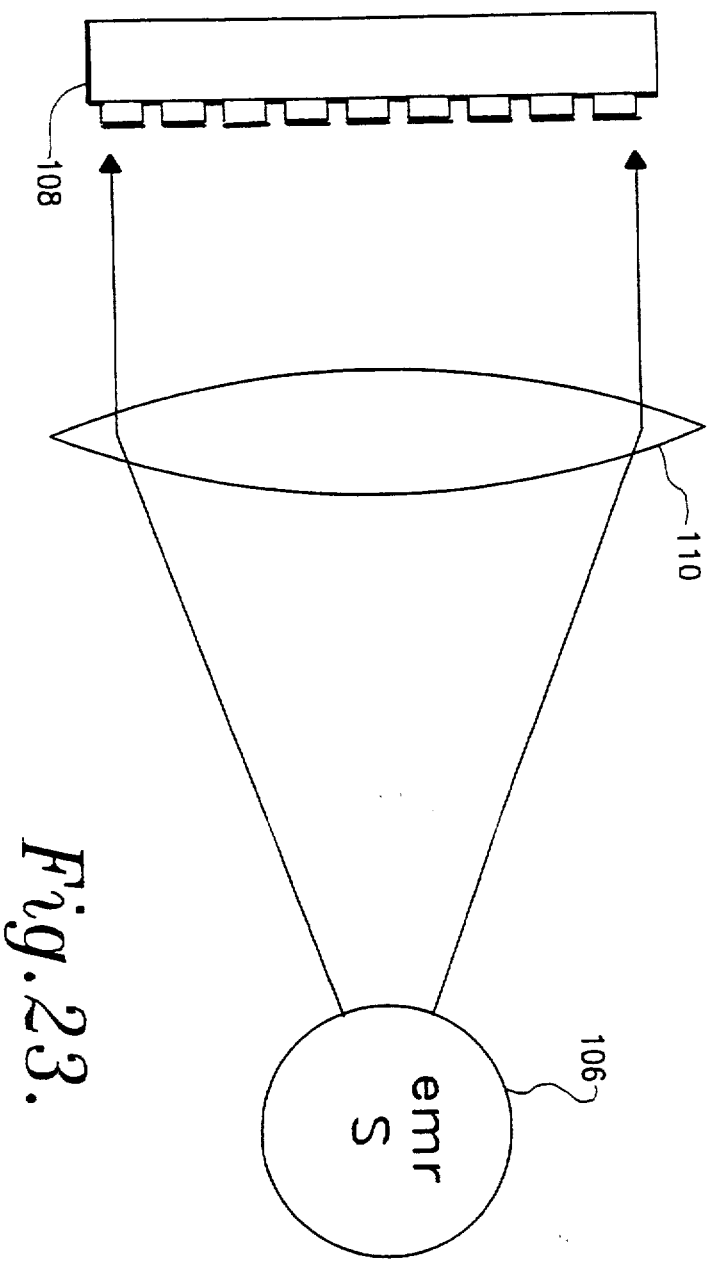
FIG. 23 is a block diagram showing the imaging of an emr source onto a detector array constructed in accordance with the invention.

The readout circuit 100 for each bridge is again preferably located under the bridge, and at least partially shaped thereby. A simplified form of a suitable readout circuit is shown in FIG. 22. The Schottky junction bridge, represented by Schottky diode 102, is connected in series with a load resistor $R_L$. A voltage source 104 is connected across the series circuit to reverse bias the Schottky junction. Changes in the Schottky leakage current appear as an output voltage $V_O$ across $R_L$, which is monitored as an indication of the emr incident on the bridge.

The detector bridges for each of the three embodiments, resistance, thermocouple and Schottky junction, are fabricated in a manner similar to the IR simulator bridge described previously. Spacer layers are established at the intended bridge locations, the bridges are formed over the spacer layers, and the spacer material is then dissolved or etched away.

An emr source 106 can be imaged onto an array 108 of the described emr detectors by placing a collimating lens 110 in the path of the emr travelling towards the detector array. While only a small number of individual detector bridges are shown on detector array 108 for simplicity, in practice the arrays would have a large number of individual bridge detectors. The actual number for any particular application would depend upon the required bridge dimension for the radiation to be detected, the available dimensions for the overall array, and the desired resolution. An array of 320×160 individual detector elements might be typical.

In practice, the sensitivity of the resistance of the bridge resistor and that of the load resistor to variations in their dimensions, as well as variations in the output voltage of the pixel circuits due to nonuniformities in bias voltage and amplifier gains, makes it important to have an on-board compensation technique to correct for the resulting image nonuniformities. Because the dimensional changes are small and could in principle also be caused by mechanical and/or ambient thermal stresses, it is necessary to corect on a periodic basis. To correct for such nonuniformities, a shutter can be placed in front of the detector array and periodically closed to obtain a black readout. This readout is stored in a ROM or other convenient storage device, and used to compensate readout with the shutter open. The system operation is preferably performed in an analog format, with the calibration information stored digitally. With a video sample rate of 30 frames per second, recalibration might be performed perhaps once an hour.

Electrical input and output lines can be conveniently run along the substrate, passing under the individual detector bridges to conserve substrate area, in a manner similar to that shown in FIGS. 2 and 10 for the IR simulator array. Power lines, ground lines, output lines and strobe lines would typically be employed.

Since numerous variation and alternate embodiments will occur to those skilled in the art, it is intended that the invention be limited only in terms of the appended claims.

We claim:
1. An infrared (IR) simulator, comprising:
a substrate formed from an insulative material, and
an array of pixel cells on said substrate, each of said cells comprising:
  a resistor bridge spanning a portion of the cell and contacting the substrate at spaced apart contact locations within the cell, said bridge being shaped to form a thermally insulative gap between the bridge and substrate between said contact locations,
  a semiconductor drive circuit on said substrate for enabling a desired amount of current flow through said resistor bridge in response to an input control signal for heating the bridge and thereby producing IR radiation therefrom, and control, actuating and power lead lines for respectively delivering control and actuating signals to said drive circuit, and an electrical power signal to said resistor bridge.

2. The IR simulator of claim 1, wherein said drive circuits are located on the substrate surface under the resistor bridges of their respective pixel cells.

3. The IR simulator of claim 2, wherein at least some of said lead lines extend under the resistor bridge of their respective pixel cells.

4. The IR simulator of claim 2, each pixel cell further comprising a thermally reflective element disposed between the resistor bridge and drive circuit of said cell, said thermally reflective element reflecting IR radiation received from said resistor bridge.

5. The IR simulator of claim 4, said thermally reflective element for each pixel cell comprising a bridge formed from a thermally reflective material bridging said drive circuit and spaced from both said drive circuit and said resistor bridge.

6. The IR simulator claim 4, said thermally reflective element for each pixel cell comprising an insulative layer overlying said drive circuit, and a thermally reflective layer overlying said insulative layer.

7. The IR simulator of claim 1, wherein said substrate comprises sapphire.

8. The IR simulator of claim 7, wherein said semiconductive drive circuit is formed from silicon.

9. The IR simulator of claim 1, said drive circuit comprising a sample and hold circuit having first and second transistors and a capacitor, said first transistor connected to apply a control signal to said capacitor and to a control input to said second transistor in response to an actuating signal, said capacitor holding the control input to said second transistor at a substantially constant level, and said second transistor being connected to apply a power signal to said resistor bridge in an amount determined by the control signal at its control input.

10. The IR simulator of claim 1, wherein the impedance of said resistor bridge substantially matches the drive circuit impedance.

11. The IR simulator of claim 1, wherein the resistor bridge from each pixel cell comprises a base bridge formed from an insulative material, and a generally conductive layer over said base bridge, the resistivity and thickness of said generally conductive layer being selected to produce a desired resistance for said resistor bridge.

12. The IR simulator of claim wherein said generally conductive layer comprises a metal.

13. The IR simulator of claim 11, wherein said generally conductive layer comprises a cermet-metal material.

14. The IR simulator of claim 11, wherein said generally conductive layer is surmounted by a coating of high thermal emissive material.

15. The IR simulator of claim 1, wherein said resistor bridge is formed from a material having an enhanced porosity which decreases its thermal conductivity.

16. The IR simulator of claim 1, further comprising means for cooling said substrate.

17. The IR simulator of claim 1, the resistor bridge for each pixel cell comprising a center span and a pair of legs extending upward from the substrate and supporting the center span, wherein the cross-sectional areas of said legs are tapered in a decreasing fashion toward said center span from cross-sectional areas at the substrate which exceed that of the center span, thereby concentrating the voltage drop across the bridge and the resultant heating at the center span spaced from the substrate.

18. An infrared (IR) simulator system, comprising
(a) a vacuum housing having an IR window,
(b) an IR pattern generator within said housing, comprising:
 (1) a substrate formed from an insulative material, and
 (2) an array of pixel cells on said substrate arranged in a matrix of rows and columns, each of said cells comprising:
  (i) a resistor bridge spanning a portion of the cell and contacting the substrate at spaced apart contact locations within the cell, said bridge being shaped to form a thermally insulative gap between the bridge and substrate between said contact locations, and
  (ii) a semiconductive drive circuit on said substrate for enabling a desired amount of current flow through said resistor bridge in response to input control and strobe signals to heat the bridge and thereby transmit IR radiation therefrom through said IR window,
 (3) a series of control lead lines for delivering respective control signals to each column of pixel cells,
 (4) a series of strobe lead lines for delivering respective strobe signal to each row of pixel cells,
 (5) a series of power lead lines for delivering an electrical power signal to said pixel cells, and
 (6) cooling means on the opposite side of said substrate from said pixel cells,
(c) means for applying successive sets of input control signals to said control lead lines,
(d) means for applying strobe signals to each of said strobe lead lines in succession, said strobe signals being applied in synchronism with said input control signals to direct said control signals to desired pixel cells, and
(e) optical means in the path of IR radiation transmitted from said IR pattern generator through said IR window for optically conditioning said radiation for detection by an IR detector.

19. The IR simulator of claim 18, wherein said drive circuits are located on the substrate surface under the resistor bridges of their respective pixel cells.

20. The IR simulator of claim 19, wherein at least some of said lead lines extend under the resistor bridge of their respective pixel cells.

21. The IR simulator of claim 19, each pixel cell further comprising a thermally reflective element disposed between the resistor bridge and drive circuit of said cell, said thermally reflective element reflecting IR radiation received from said resistor bridge.

22. The IR simulator of claim 18, wherein said substrate comprises sapphire.

23. The IR simulator of claim 22, wherein said semiconductive drive circuit is formed from silicon.

24. An infrared (IR) radiating element, comprising:
a substrate formed from an insulative material,
a resistor bridge spanning a portion of said substrate and contacting the substrate at spaced apart contact locations, said bridge being shaped to form a thermally insulative gap between the bridge and substrate between said contact locations, and a semiconductive drive circuit on said substrate for directing a current through said bridge to heat the bridge and thereby produce IR radiation therefrom.

25. The IR radiating element of claim 24, wherein said drive circuit is located on the substrate surface under said resistor bridge.

26. The IR radiating element of claim 24, further comprising a thermally reflective element disposed under and spaced from the resistor bridge, said thermally reflective element reflecting IR radiation received from said resistor bridge.

27. The IR radiating element of claim 26, wherein said drive circuit is located on the substrate surface under said thermally reflective element.

28. The IR radiating element of claim 27, said thermally reflective element comprising a bridge formed from a thermally reflective material bridging said drive circuit and spaced from both said drive circuit and said resistor bridge.

29. The IR radiating element of claim 27, said thermally reflective element for each pixel cell comprising an insulative layer overlying said drive circuit, and a thermally reflective layer overlying said insulative layer.

30. The IR radiating element of claim 24, wherein said substrate comprises sapphire.

31. The IR radiating element of claim 30, wherein said semiconductive drive circuit is formed from silicon.

32. The IR radiating element of claim 24, wherein the impedance of said resistor bridge substantially matches the drive circuit impedance.

33. The IR radiating element of claim 24, wherein said resistor bridge comprises a base bridge formed from an insulative material, and a generally conductive layer over said base bridge, the resistivity and thickness of said generally conductive layer being selected to produce a desired resistance for said resistor bridge.

34. The IR radiating element of claim 33, wherein said generally conductive layer comprises a metal.

35. The IR radiating element of claim 33, wherein said generally conductive layer comprises a cermet-metal material.

36. The IR radiating element of claim 33, wherein said generally conductive layer is surmounted by a coating of high thermal emissive material.

37. The IR radiating element of claim 24, wherein said resistor bridge is formed from a material having an enhanced porosity which decreases its thermal conductivity.

38. The IR radiating element of claim 24, said resistor bridge comprising a center span and a pair of legs extending upward form the substrate and supporting the center span, wherein the cross-sectional areas of said legs are tapered in a decreasing fashion toward said center span from cross-sectional areas at the substrate which exceed that of the center span, thereby concentrating the voltage drop across the bridge and the resultant heating at the center span spaced from the substrate.

* * * * *

UNITED STATES PATENT AND TRADEMARK OFFICE
CERTIFICATE OF CORRECTION

PATENT NO. : 4,922,116
DATED : May 1, 1990
INVENTOR(S) : J. Grinberg et al

It is certified that error appears in the above-indentified patent and that said Letters Patent is hereby corrected as shown below:

The drawing sheets consisting of Figs 11-23 should be added as shown on the attached pages.

Col. 6, line 36, delete "Additional" before the word "features" and change "features" to --Features--.

Col. 15, (claim 12) line 1, after thw ord "claim" insert therefor --11--.

Signed and Sealed this

Twentieth Day of September, 1994

Attest:

BRUCE LEHMAN

Attesting Officer    Commissioner of Patents and Trademarks

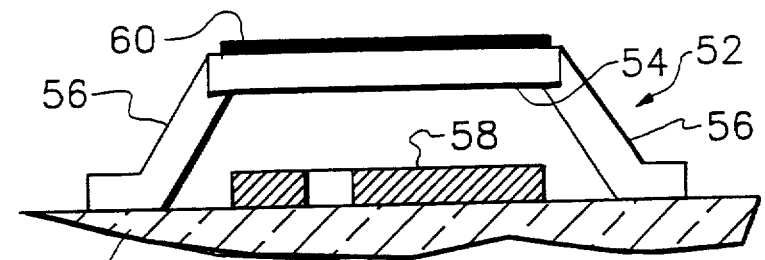
Fig. 11.
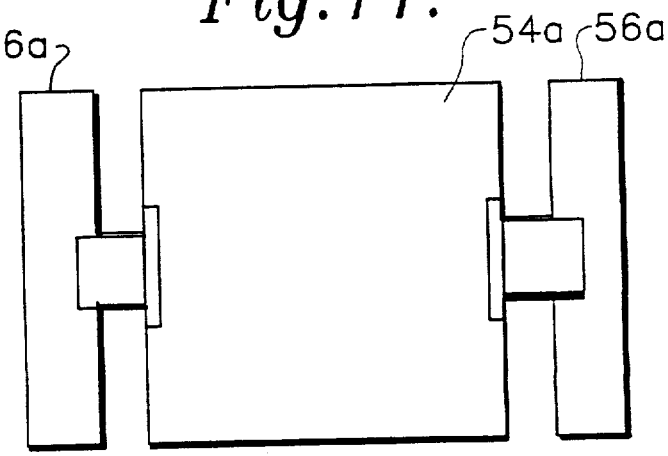
Fig. 12.a.
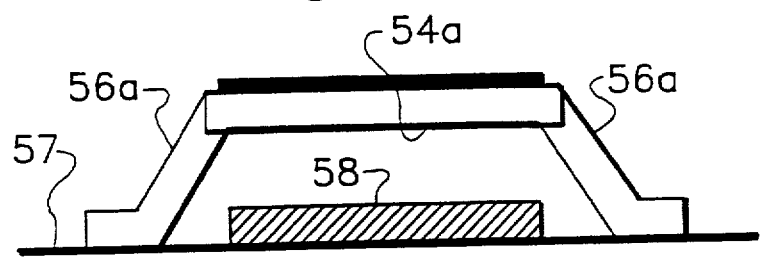
Fig. 12.b.

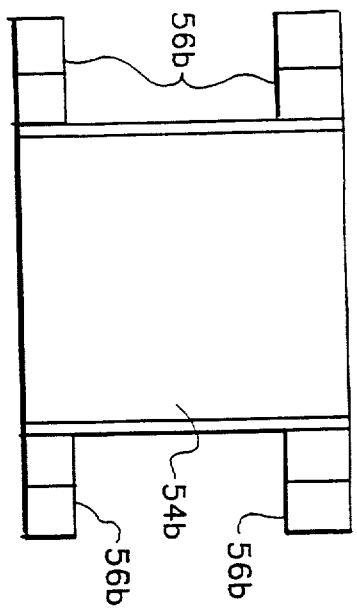
Fig. 13.a.
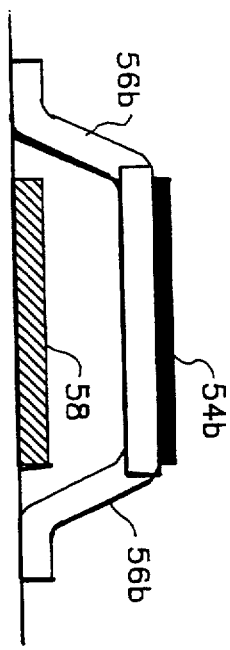
Fig. 13.b.
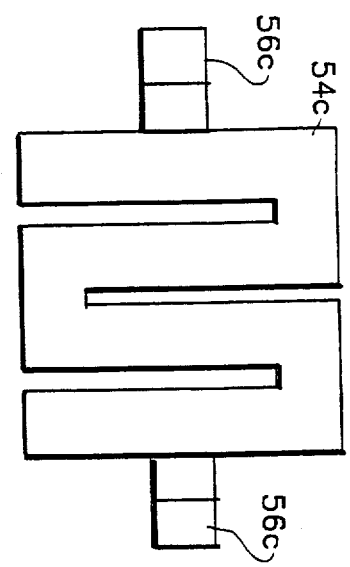
Fig. 14.a.
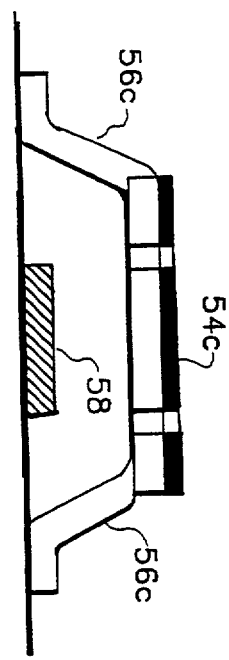
Fig. 14.b.